US012677502B2

(12) United States Patent
Jin et al.

(10) Patent No.: US 12,677,502 B2
(45) Date of Patent: Jul. 7, 2026

(54) SILICON SOLAR CELL AND MODULE

(71) Applicant: LONGI GREEN ENERGY TECHNOLOGY CO., LTD., Xi'an (CN)

(72) Inventors: Yupeng Jin, Xi'an (CN); Long Yu, Xi'an (CN); Hongbo Tong, Xi'an (CN)

(73) Assignee: LONGi Green Energy Technology Co., Ltd., Xi'An (CN)

( * ) Notice: Subject to any disclaimer, the term of this patent is extended or adjusted under 35 U.S.C. 154(b) by 0 days.

(21) Appl. No.: 19/124,103

(22) PCT Filed: Jan. 21, 2025

(86) PCT No.: PCT/CN2025/073536
§ 371 (c)(1),
(2) Date: Apr. 24, 2025

(87) PCT Pub. No.: WO2025/232297
PCT Pub. Date: Nov. 13, 2025

(65) Prior Publication Data
US 2026/0114073 A1 Apr. 23, 2026

(30) Foreign Application Priority Data
May 8, 2024 (CN) .......................... 202410564554.8

(51) Int. Cl.
*H10F 77/1223* (2025.01)
*H10F 10/174* (2025.01)
*H10F 77/30* (2025.01)

(52) U.S. Cl.
CPC ....... *H10F 77/1223* (2025.01); *H10F 10/174* (2025.01); *H10F 77/311* (2025.01)

(58) Field of Classification Search
CPC ... H10F 77/1223; H10F 77/311; H10F 10/174
See application file for complete search history.

(56) References Cited

U.S. PATENT DOCUMENTS

2011/0253210 A1 10/2011 Lee et al.
2013/0298974 A1 11/2013 Yang et al.
(Continued)

FOREIGN PATENT DOCUMENTS

CN 103107236 A 5/2013
CN 113948601 A 1/2022
(Continued)

OTHER PUBLICATIONS

Office Action in Australian Appln. No. 2025202535, dated May 16, 2025, 3 pages.
(Continued)

*Primary Examiner* — Jayne L Mershon
(74) *Attorney, Agent, or Firm* — Fish & Richardson P.C.

(57) ABSTRACT

The present application relates to a silicon solar cell. In one example, a silicon solar cell includes a silicon substrate including an antimony element; and a carrier separation layer, formed on the silicon substrate. At least some regions of the carrier separation layer on a side close to the silicon substrate have an antimony-containing layer. The antimony-containing layer includes the antimony element. A peak concentration of the antimony element in the antimony-containing layer is $a_1$, and $a_1$ is equal to or greater than 1E13 atoms/cm$^3$.

20 Claims, 4 Drawing Sheets

(56) References Cited

U.S. PATENT DOCUMENTS

| | | | | |
|---|---|---|---|---|
| 2016/0197204 A1* | 7/2016 | Lee | | H10F 71/131 |
| | | | | 136/255 |
| 2020/0313010 A1 | 10/2020 | Nanba | | |
| 2023/0395740 A1* | 12/2023 | Mao | | H10F 10/10 |

FOREIGN PATENT DOCUMENTS

| | | | |
|---|---|---|---|
| CN | 114744052 A | | 7/2022 |
| CN | 114744063 A | | 7/2022 |
| CN | 116722049 A | | 9/2023 |
| CN | 117702269 A | | 3/2024 |
| CN | 117712204 A | | 3/2024 |
| CN | 118398684 A | | 7/2024 |
| CN | 119836046 B | * | 6/2025 |
| CN | 120224837 A | * | 6/2025 |
| KR | 20100043373 A | | 4/2010 |
| KR | 20100064478 A | | 6/2010 |

| | | | |
|---|---|---|---|
| WO | 2022/134991 A1 | | 6/2022 |
| WO | 2023/097365 A1 | | 6/2023 |
| WO | WO 2023123808 A1 | | 7/2023 |

OTHER PUBLICATIONS

Glunz et al., "Passivating and Carrier-selective Contacts—Basic Requirements and Implementation," Presented at the 44th IEEE Photovoltaic Specialist Conference (PVSC), Washington D.C., USA, Jun. 25-30, 2017, 7 pages.

Office Action in Australian Appln. No. 2025202535, mailed on Sep. 22, 2025, 8 pages.

International Search Report and Written Opinion in International Appln. No. PCT/CN2025/073536, mailed on Mar. 1, 2025, 22 pages (with machine translation).

Office Action in Chinese Appln. No. 202410564554.8, dated Oct. 9, 2024, 16 pages (with English translation).

* cited by examiner

SILICON SOLAR CELL AND MODULE

CROSS-REFERENCE TO RELATED APPLICATIONS

This application is a 371 national stage application of PCT Application No. PCT/CN2025/073536, filed on Jan. 21, 2025, which claims priority to Chinese Patent Application No. 202410564554.8, filed on May 8, 2024. The disclosures of the aforementioned applications are hereby incorporated by reference in their entireties.

TECHNICAL FIELD

The present application relates to the solar photovoltaic field, and specifically, to a silicon solar cell and a module.

BACKGROUND

Currently, in a silicon solar cell, an n-type doped silicon wafer or a p-type doped silicon wafer is usually used as a substrate. P-type and n-type doped semiconductors are respectively formed at different positions of the silicon wafer, and then electrodes are respectively formed on regions of the p-type and n-type doped semiconductors. When light shines into the substrate of the silicon solar cell, electron-hole pairs are generated. Carrier separation is performed on free electron-hole pairs, so that electrons are accumulated near an n-pole and holes are accumulated near a p-pole. When an external circuit is connected to the electrode, a current can be output.

In the related art, a p-type substrate or an n-type substrate is usually used as a semiconductor substrate of solar cell. The p-type substrate is usually doped with the boron element or the gallium element. The n-type substrate is usually doped with the phosphorus element.

SUMMARY

Because an n-type substrate has an advantage of a long diffusion length of minority carriers, when the n-type substrate is used in a silicon solar cell for power generation, in comparison with a case in which a p-type substrate is used, more carriers are collected, and therefore, higher efficiency can be achieved correspondingly. The n-type substrate is usually doped with a phosphorus element. However, regardless of whether the n-type substrate or the p-type substrate is used, efficiency reduction is caused by poor passivation. Therefore, the present application is intended to change the problem of poor passivation in the related art.

It is found in the present application that when a silicon substrate is doped with an antimony element, because the antimony element can overflow to a semiconductor layer to a certain extent, the antimony element overflowing to the semiconductor layer may be bound to Si in the semiconductor layer, to suppress generation of air bubbles in the semiconductor layer, and avoid forming holes. This can effectively improve passivation and solve a problem of carrier transport suppression.

The present application relates to the following contents:

According to a first aspect, a silicon solar cell is provided, including:

a silicon substrate, the silicon substrate including an antimony element; and a carrier separation layer, formed on the silicon substrate, where at least some regions of the carrier separation layer on a side close to the silicon substrate have an antimony-containing layer, the antimony-containing layer including an antimony element; and a peak concentration of the antimony element in the antimony-containing layer is a1, a1 being equal to or greater than 1E13 atoms/cm3.

According to a second aspect, a solar cell module is provided, including the silicon solar cell according to any one of the embodiments.

REFERENCE NUMERALS

Figure 1:
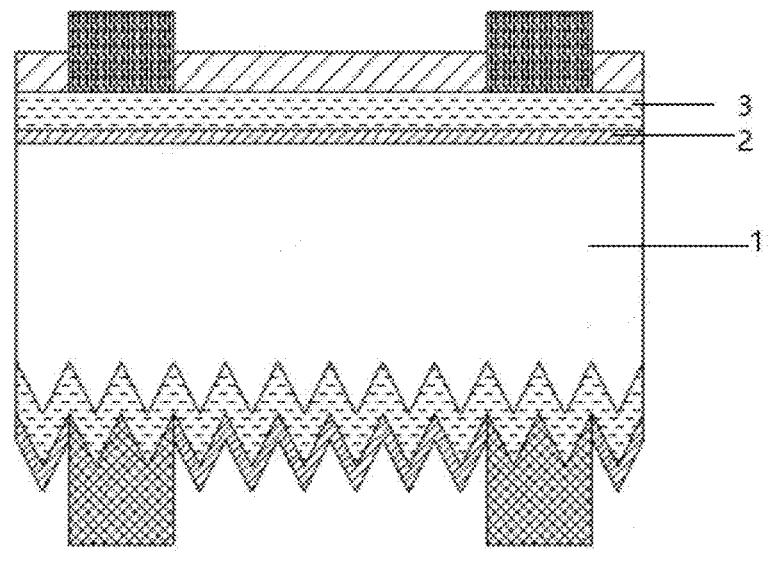
FIG. 1 is a structural diagram of a conventional TOPCon solar cell.

1: silicon substrate, 2: interface passivation layer, 3: doped semiconductor layer, 4: antimony-containing layer, 5: Bx-containing layer, 21: first interface passivation layer, 31: first doped semiconductor layer, 41: first antimony-containing layer, 51: first Bxp-containing layer, 22: second interface passivation layer, 32: second doped semiconductor layer, 42: second antimony-containing layer, 52: second Bxn-containing layer, 6: substrate passivation layer, 7: intrinsic region interface passivation layer, 8: intrinsic semiconductor layer containing an antimony element, 9: intrinsic semiconductor layer not containing an antimony element, 10: intrinsic region side interface passivation layer, and 11: p-region electrode.

DETAILED DESCRIPTION

The following implementations of the present application are merely used for describing specific implementations for implementing the present application, and these implementations should not be construed as a limitation to the present application. Any alternation, modification, substitution, combination, and simplification without departing from the spiritual essence and principles of the present application are all considered as equivalent replacements, and all fall within the scope of protection of the present application.

Specific embodiments of the present application are described in more detail below. However, it should be understood that, the present application can be implemented in various manners and should not be limited by the embodiments described herein. On the contrary, the embodiments are provided, so that the present application can be understood more thoroughly and a scope of the present application can be completely conveyed to a person skilled in the art.

It should be noted that, some terms are used in this specification and the claims to refer to particular components. A person skilled in the art should understand that, the person skilled in the art may refer to a same component by using different terms. In this specification and the claims, a difference of terms is not used as a manner of distinguishing between components, but a difference of functions of the components is used as a criterion for distinguishing. For example, "include" or "comprise" throughout this specification and the claims is an open term, and therefore, should be interpreted as "include but not limited to". Subsequent descriptions in this specification are preferred implementations for implementing the present application. However, the descriptions are intended to serve as a general principle of this specification, and are not intended to limit the scope of the present application. The protection scope of the present application shall be subject to a scope defined by the appended claims.

As used herein, "substantially free of" with respect to a specified component is used in this specification to represent that the specified component is not deliberately formulated into a compound and/or exists only as a pollutant or in trace amount. Therefore, a total amount of a specified component caused by any accidental pollution of the compound is less than 0.05%, and preferably less than 0.01%. Most preferably, the amount of the specified component in the compound cannot be detected by using a standard analysis method.

As used in this specification, "a" or "an" may indicate one or more. As used in the claims, when used together with the term "comprise", the terms "a" or "an" may indicate one or more than one.

The term "or" used in the claims is used to represent "and/or", unless it is explicitly indicated that only an alternative solution is referred to, or that alternative solutions are mutually exclusive, although the present disclosure supports a definition of referring to only an alternative solution and a definition of "and/or". As used herein, "another" may indicate at least a second or more.

In the present application, a front surface of the silicon substrate refers to a surface of a side of a solar cell facing sunlight in a normal operating condition, and a back surface refers to a surface of the other side of the silicon substrate opposite to the front surface.

A person skilled in the art may understand that, the term "silicon wafer" generally refers to a silicon die raw material, and the term "silicon substrate" generally refers to a part formed by the silicon wafer in a solar cell. The term "light absorber" generally refers to the functional component in solar cells responsible for absorbing photons, generating photo-generated carriers, and separating them. The light absorber includes a silicon substrate and a region (for example, a tunneling layer and a dope polycrystalline layer in a TOPCon structure) for separating carriers generated by the silicon substrate. The silicon substrate is used for absorbing light and generating photo-generated carriers. It may be understood that, only an emission reduction layer, another functional layer, and an electrode are not light absorbing bodies. A person skilled in the art may understand that, the light absorber or the silicon substrate may be recycled from a solar cell, and the silicon substrate defined in the present application may be obtained by stripping different stack structures.

In the present application, a doped region, for example, a region in which the Group-IIIA element (boron element) is diffused in the following TOPCon solar cell, may also be used for separating photo-generated carriers.

In other words, the silicon substrate is obtained from a silicon die. The silicon substrate includes a silicon substrate part and a doped region part. The silicon substrate part is a body region not doped in a solar cell process, and performance thereof is the same as that of a silicon die raw material. The doped region may be a region whose doping element is different from that of the body part, and other performance and parameters are basically the same as those of the body part, for example, a doped region formed through direct doping or internal diffusion doping inside a silicon die. In addition, in some cases, the doped region is an antimony element or another doping element such as a Group-IIIA element or a Group-VA element. Specifically, for example, the doped region is a region where B or P is accumulated. In some cases, the doped region may be basically the same as the body region, in other words, mainly includes an antimony element doped region.

In a solar cell (for example, a TOPCon solar cell, a partial TOPCon solar cell, a hybrid back contact battery, or a TBC solar cell) at least partially having a TOPCon structure, the silicon substrate usually includes a doped region formed on a surface of at least one side of the silicon substrate, and a part of performance of the doped region is the same as that of a silicon die raw material. The doped region may have a doping element different from that of the body region, and other performance and parameters of the doped region are basically the same as those of the body region, to be specific, properties such as concentrations of the antimony element, resistivity change rates, and resistivity offset rates of the doped region and the body region are basically the same. Such a doped region may be formed by using a silicon die through directly doping described in detail below, or may be formed by doping the doping element in the silicon die, for example, through layers such as a doping passivation layer and an interface passivation layer. In the present application, for the solar cell at least partially having the TOPCon structure, the doped region usually refers to a region formed through direct doping or internal diffusion doping inside a silicon wafer raw material. The internal diffusion doping is doping of polycrystalline silicon referred to as a doped layer into a silicon die through a tunneling layer referred to as a passivation layer.

In the present application, the foregoing silicon wafer related in the present application is not further limited, and may be a silicon wafer (which may also be referred to as a silicon die) obtained through machining and slicing after a silicon rod is pulled. The silicon substrate in the present application may be a part of a silicon substrate stripped and recycled from a solar cell module, provided that the part of the silicon substrate has a particular shape and can present a sheet shape, in other words, a size of a surface is greater than a size of another surface perpendicular to the surface, and the silicon substrate is in a flat shape or a plate shape. The size of the silicon wafer or the silicon substrate in the present application is not limited either. The silicon wafer or the silicon substrate may be a stripped part of a silicon substrate of any size that is obtained by recycling a light absorber from a solar cell module and stripping other layer structures. In addition, a person skilled in the art may understand that, during stripping, if a doped region is partially damaged, provided that a part of the doped region still exists, it should also be understood that the part of the dope region is the silicon substrate described in the present application, and a solar cell having such a silicon substrate is also a solar cell conforming to the definition of the present application. For example, in some embodiments, a length of at least one side of the silicon wafer or the silicon substrate (including the part of the silicon substrate obtained by recycling and stripping the other layer structures) in the present application is greater than 156 mm, for example, may be (158±2) mm, (160±2) mm, (165=2) mm, (170)±2) mm, (175±2) mm, (180)±2) mm, (185±2) mm, (190±2) mm, (195=2) mm, (200±2) mm, (205±2) mm, (210±2) mm, (215±2) mm, (220)±2) mm, (225±2) mm, (230)±2) mm, (235±2) mm, (240±2) mm, (245±2) mm, (250)±2) mm, (255±2) mm, (260±2) mm, (265±2) mm, (270±2) mm, (275±2) mm, and any range between these values. For example, in some embodiments, a thickness of the silicon wafer or the silicon substrate (including the part of the silicon substrate obtained by recycling and stripping the other layer structures) in the present application at least ranges from 40 μm to 170 μm, and for example, may be 40 μm, 50 μm, 60 μm, 70 μm, 80 μm, 90 μm, 100 μm, 110 μm, 120 μm, 130 μm, 140 μm, 150 μm, 160 μm, or 170 μm. In some embodiments, a size of the part of the silicon substrate obtained by recycling and stripping the other layer structures may be smaller than the foregoing size, provided that a concentration of the antimony element and a resistivity of the part of the silicon substrate can be detected, and a resistivity change rate, an average resistivity offset rate, and other limitations related in the present application can be calculated.

In the present application, a concentration of the antimony element in the silicon wafer, the silicon substrate, or a carrier separation layer (for example, a doped semiconductor layer, a molybdenum oxide layer, or a PEDOT:PSS layer) may be detected by using any known method by a person skilled in the art. The person skilled in the art may select the method based on a requirement, for example, the concentration of the antimony element may be detected by using methods such as SIMS, ICP-MS, and GDMS, and preferably, the concentration of the antimony element is detected by using the ICP-MS method. A person skilled in the art may understand that, the concentration of the antimony element on the silicon wafer or the silicon substrate may refer to a concentration of the antimony element on a surface of the silicon wafer, the silicon substrate, or the carrier separation layer, or any position in the silicon wafer, the silicon substrate, or the carrier separation layer, and it is clear that, the concentration of the antimony element may alternatively be an average value of concentrations of the antimony element on a plurality of positions, or an average value of a concentration of the antimony element on the entire silicon wafer, silicon substrate, or carrier separation layer. A person skilled in the art may select any of the foregoing sites for detection based on a detection condition and a used instrument based on an actual situation, or may calculate an average value of a plurality of sites after detecting the plurality of sites and use the average value as the concentration of the antimony element. In some embodiments, the concentration of the antimony element refers to an average value detected in the thickness of the silicon wafer, the silicon substrate, or the carrier separation layer. For example, the concentration of the antimony element is detected on the silicon wafer in the thickness direction by using the SIMS method, and an average value of the concentration in the thickness direction is obtained.

In the present application, the concentration of the antimony element detected on the silicon substrate as described above is considered as a; and at least some regions on a side of the carrier separation layer close to the silicon substrate have a maximum value of the concentration of the antimony element detected by using the foregoing method in the antimony-containing layer formed by the antimony element, that is, a peak concentration of the antimony element in the antimony-containing layer is a1.

In the present application, concentrations of Bx, Bxn, and Bxp in the silicon substrate may be detected by using any known method by a person skilled in the art. The person skilled in the art may select the method based on a requirement, for example, the concentrations of Bx, Bxn, and Bxp may be detected by using methods such as SIMS, ICP-MS, and GDMS, and preferably, the concentrations of Bx, Bxn, and Bxp are detected by using the ICP-MS method. A person skilled in the art may understand that the concentrations of Bx, Bxn, and Bxp in the silicon substrate may refer to concentrations of Bx, Bxn, and Bxp at a surface of a doped region of the silicon substrate, or at any position in the doped region of the silicon substrate, and it is clear that, the concentrations of Bx, Bxn, and Bxp in the silicon substrate may alternatively be an average value of concentrations of Bx, Bxn, and Bxp at a plurality of positions, or an average value of concentrations of Bx, Bxn, and Bxp within a range of the entire silicon substrate. A person skilled in the art may select any of the foregoing sites for detection based on a detection condition and a used instrument based on an actual situation, or may calculate an average value of a plurality of sites after detecting the plurality of sites and use the average value as the concentrations of Bx. Bxn, and Bxp. In some embodiments, the concentrations of Bx, Bxn, and Bxp refer to an average value detected in the thickness of the doped region of the silicon substrate. For example, the concentrations of Bx, Bxn, and Bxp in the doped region of the silicon substrate are detected in the thickness direction by using the SIMS method, and an average value of the concentrations of Bx, Bxn. and Bxp in the thickness direction is obtained.

A person skilled in the art may completely understand that, the foregoing detection on the silicon wafer or the silicon substrate may be detection on a silicon wafer or a silicon substrate of any size, may be detection on a silicon die obtained by slicing after a silicon rod is pulled, or may be detection on a stripped silicon substrate obtained by recycling a solar cell or a module and stripping other layer structures, provided that detection results obtained by performing detection according to the method described in the present application all fall within the scope of the present application, and all should be considered to fall within the scope of the silicon wafer, the solar cell, the solar cell string, or the solar cell module that are protected by the claims of the present application.

In the present application, a method for detecting whether a silicon wafer or a silicon substrate includes an element may be a method such as SIMS, ICP-MS, or GDMS, and preferably, a metal element is detected by using the ICP-MS method. In the present application, the solar cell is also referred to as a cell.

In some embodiments of the present application, a silicon wafer (for example, a silicon die) or a silicon substrate in the present application is only doped with the antimony element as a Group-VA doping element to replace the phosphorus element. In this case, a person skilled in the art may understand that, based on different sources of raw materials of silicon wafers, the silicon wafer or the silicon substrate may include another element, for example, any one, two, or three of phosphorus, gallium, and germanium, but is only actively doped with the antimony element as the Group-VA doping element to replace the phosphorus element.

FIG. 1 shows a conventional TOPCon solar cell. The TOPCon solar cell sequentially includes a silicon substrate 1, an interface passivation layer 2, and a doped semiconductor layer 3. An existing solar cell has a problem that efficiency reduction is caused by poor passivation.

Figure 2:
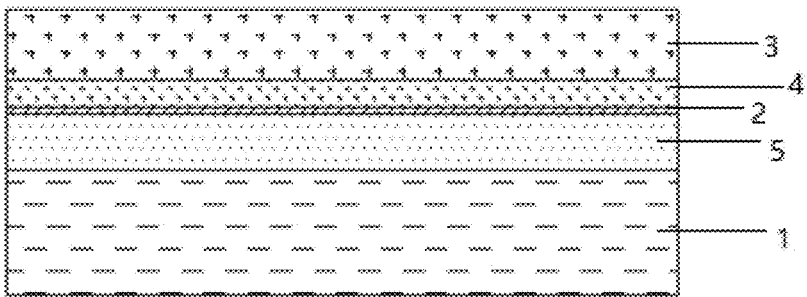
FIG. 2 is a detailed diagram of a passivated contact structure including an antimony element.

For the problem existing in the related art, the present application provides a silicon solar cell. As shown in FIG. 2, the silicon solar cell includes: a silicon substrate 1, where the silicon substrate 1 includes antimony element; and a carrier separation layer formed on the silicon substrate 1. At least some regions of the carrier separation layer on a side close to the silicon substrate 1 have an antimony-containing layer 4; the antimony-containing layer 4 containing the antimony element, and a peak concentration of the antimony element in the antimony-containing layer 4 is a1, and a1 is equal to or greater than 1E13 atoms/cm$^3$. For example, the peak concentration of the antimony element in the antimony-containing layer 4 may be 1E13 atoms/cm3, 5E13 atoms/cm3, 1E14 atoms/cm3, 5E14 atoms/cm3, 1E15 atoms/cm3, 5E15 atoms/cm3, 1E16 atoms/cm$^3$, 5E16 atoms/cm3, 1E17 atoms/cm3, 5E17 atoms/cm3, 1E18 atoms/cm$^3$, and any value between these values.

The peak concentration of the antimony element in the antimony-containing layer 4 is equal to or greater than 1E13 atoms/cm3. In this way, a proportion of air bubbles existing in the carrier separation layer in the related art can be reduced, and a problem of passivation and power transmission of the carrier separation layer can be both taken into consideration, and mechanical performance of the solar cell is improved, thereby improving efficiency of the solar cell.

In some embodiments, the concentration of the antimony element in the silicon substrate 1 is a, and the a ranges from 1E13 to 1E18 atoms/cm$^3$, for example, may be 1E13 atoms/cm3, 5E13 atoms/cm3, 1E14 atoms/cm3, 5E14 atoms/cm3, 1E15 atoms/cm3, 5E15 atoms/cm3, 1E16 atoms/cm3, 5E16 atoms/cm3, 1E17 atoms/cm3, 5E17 atoms/cm3, 1E18 atoms/cm3, and any value between these values.

Because the Sb element is doped in the silicon substrate 1, and the doping concentration of the Sb element is low, there are few defects, a charge mobility of the silicon substrate can be improved and a resistivity of the silicon substrate can be reduced. In addition, the Sb element can reduce band-edge energy level differentiation of crystalline silicon caused by the doping, and the doping ionization rate of the Sb element is high.

In some embodiments, the antimony-containing layer 4 has a region in which the concentration of the element antimony is equal to greater than 1E13 atoms/cm$^3$; a thickness d1 of the region is 2 nm or higher, for example, may be 2 nm, 5 nm, 10 nm, 15 nm, 20 nm, 25 nm, or 30 nm, or any value between these values.

In some embodiments, a/a1 is defined as u, and u ranges from 0.8 to 1E10, for example, may be 0.8, 0.9, 1, 2, 5, 10, 50, 100, 500, 1000, 1E5, 5E5, 1E6, 5E6, 1E7, 5E7, 1E8, 5E8, 1E9, 5E9, 1E10, or any value between these values.

In some embodiments, u ranges from 2 to 1E9. In some embodiments, u ranges from 10 to 1E8. In some embodiments, u ranges from 100 to 1E7.

In some embodiments, the interface passivation layer 2 is not disposed between the silicon substrate and the carrier separation layer. In this case, u ranges from 1 to 2. For example, u may be 1, 1.1, 1.2, 1.3, 1.4, 1.5, 1.6, 1.7, 1.8, 1.9, or 2.0. By setting u in the foregoing range, it can be ensured that a concentration of antimony element that escapes from the silicon substrate to the carrier separation layer reaches a preset value, thereby reducing a proportion of air bubbles and improving a passivation effect.

In some embodiments, the interface passivation layer 2 with a function of absorbing impurities is disposed between the silicon substrate and the carrier separation layer. In this case, u ranges from 0.8 to 1E10, for example, may be 0.8, 0.9, 1, 2, 5, 10, 50, 100, 500, 1000, 1E5, 5E5, 1E6, 5E6, 1E7, 5E7, 1E8, 5E8, 1E9, 5E9, 1E10, or any value between these values. By setting u in the foregoing range, it can be ensured that a concentration of antimony element that escapes from the silicon substrate to the carrier separation layer reaches a preset value, thereby reducing the proportion of air bubbles and improving the passivation effect.

In some embodiments, the interface passivation layer 2 without the function of absorbing impurities is disposed between the silicon substrate and the carrier separation layer. In this case, u ranges from 2 to 1E9, for example, may be 2, 3, 4, 5, 6, 7, 8, 9, 10, 50, 100, 500, 1000, 1E5, 5E5, 1E6, 5E6, 1E7, 5E7, 1E8, 5E8, 1E9, or any value between these values. By setting u in the foregoing range, it can be ensured that a concentration of antimony element that escapes from the silicon substrate to the carrier separation layer reaches a preset value, thereby reducing the proportion of air bubbles and improving the passivation effect.

It is set that the concentration of the antimony element in the silicon substrate 1 ranges from 1E13 to 1E18 atoms/cm$^3$, and/or the thickness d1 of the region in which the concentration of the antimony element in the antimony-containing layer 4 is equal to or greater than 1E13 atoms/cm3 is 2 nm or higher. Because composition at an interface between the carrier separation layer and the silicon substrate 1 is mainly from the carrier separation layer of a particular thickness close to the silicon substrate, by controlling the concentration of the antimony element within the foregoing range, the proportion of air bubbles within a thickness range of 2 nm can be reduced, and further, the problem of composition at the bottom layer of the carrier separation layer caused by the air bubbles is improved, so that the passivation problem of the entire carrier separation layer can be substantially resolved, thereby improving the efficiency of the solar cell.

In the present application, the carrier separation layer may be selected from a doped semiconductor layer, a molybdenum oxide layer, or a PEDOT:PSS layer. When the carrier separation layer is the doped semiconductor layer 3, the interface passivation layer 2 is disposed between the silicon substrate 1 and the carrier separation layer. The interface passivation layer 2 can further improve an interface passivation effect between the silicon substrate and the carrier separation layer.

Materials and thicknesses that are already known in the related art may be used as materials and thicknesses of the doped semiconductor layer 3 and the interface passivation layer 2. For example, the thickness of the doped semiconductor layer 3 may range from 50 nm to 300 nm. The material of the doped semiconductor layer 3 may be selected from one or two or more of polycrystalline silicon, amorphous silicon, or microcrystalline silicon. The thickness of the interface passivation layer 2 may range from 0.1 nm to 5 nm. The material of the interface passivation layer 2 may be selected from one or two or more of silicon oxide, aluminum oxide, silicon nitride, molybdenum oxide, or intrinsic amorphous silicon. Because composition at an interface between the carrier separation layer and the interface passivation layer 2 is mainly from the carrier separation layer of a particular thickness close to the interface passivation layer 2, based on the foregoing parameter range, the proportion of air bubbles within a thickness range of 2 nm can be reduced, and further, the problem of composition at the bottom layer of the carrier separation layer caused by the air bubbles is improved, so that the passivation problem of the entire carrier separation layer can be substantially resolved, thereby improving the efficiency of the solar cell.

In some embodiments, the concentration of the antimony element in the antimony-containing layer 4 of the carrier separation layer gradually decreases in a direction from the side close to the silicon substrate 1 to a side facing away from the silicon substrate 1. The setting is mainly because when the concentration of the antimony on the side close to the silicon substrate 1 is large, air bubbles can be reduced, and therefore, there are fewer composition problems caused by the air bubbles. There is no air bubble in the silicon substrate, and escape of the antimony element in the silicon substrate 1 does not affect passivation of the silicon substrate 1. In addition, surface composition has large impact on overall composition, and therefore, a larger concentration of the antimony closer to the surface of the carrier separation layer 4 indicates a better passivation effect at the interface.

Further, as shown in FIG. 2, at least some regions of the silicon substrate 1 on a side close to the interface passivation layer 2 have a Bx element, to form a Bx-containing layer 5. The Bx element may be an element of Group-VA (for example, phosphorus) or Group-VIA (for example, sulfur), or may be an element of Group-IIIA (for example, boron or aluminum). Because the at least some regions on the side close to the interface passivation layer 2 have the Bx element, an emitter electrode or a high-low junction can be formed in the silicon substrate 1, to achieve a passivation function and further improve the performance of the solar cell.

In some embodiments, a thickness d2 of a region in the Bx-containing layer 5 in which a concentration of the Bx element is greater than 1E17 atoms/cm$^3$ is 20 nm or higher, for example, may be 20 nm, 50 nm, 100 nm, 200 nm, 500 nm, 1 μm, 2 μm, or 5 μm, or any value between these values.

In some embodiments, the doped semiconductor layer 3 includes the Bx element, a concentration of the Bx element included in the doped semiconductor layer 3 is b, and b ranges from 1E18 to 5E22 atoms/cm$^3$. A peak concentration of the Bx element in the Bx-containing layer 5 is b1 atoms/cm$^3$, b/b1 is defined as v, and v ranges from 0.5 to 1E10, for example, may be 0.5, 0.6, 0.7, 0.8, 0.9, 1, 2, 5, 10, 50, 100, 500, 1000, 1E5, 5E5, 1E6, 5E6, 1E7, 5E7, 1E8, 5E8, 1E9, 5E9, 1E10, or any value between these values. In some embodiments, v ranges from 2 to 1E9. In some embodiments, v ranges from 10 to 1E8. In some embodiments, v ranges from 100 to 1E5.

In some embodiments, a concentration of phosphorus in the interface passivation layer 2 is higher than that in the carrier separation layer (the doped semiconductor layer 3).

When Bx is the phosphorus element, v ranges from 0.5 to 1E10. When Bx is another element, v ranges from 1 to 1E10. Bx can perform internal diffusion into the silicon substrate 1 to reach a preset concentration. The Bx element can form, based on a property of the Bx element, an emitter electrode or a high-low junction, thereby improving the passivation effect. However, an excessively high doping concentration of Bx introduces a composition center in the silicon substrate 1, and consequently, reduces the performance of the solar cell. In the present application, the range of v may be controlled, to improve the passivation effect without affecting the performance of the solar cell.

In some embodiments, b1/a1 is defined as w, and w>1, for example, may be 10, 100, 1000, 1E4, 5E4, 1E5, 5E5, 1E6, 5E6, 1E7, 5E7, 1E8, or any value between these values. In some embodiments, w>100. In some embodiments, w is greater than 1000. In some embodiments, w ranges from 1E3 to 1E8.

In the present application, larger b1 indicates a better passivation effect of the formed emitter electrode or high-low junction, and indicates higher performance of the solar cell. Therefore, b1 cannot be excessively small, in other words, w cannot be excessively small. If w is excessively small, the passivation effect of the formed emitter electrode or high-low junction becomes poor. Therefore, w should be greater than 1. However, excessively large b1 (in other words, excessively large w) introduces a composition center in the silicon substrate 1, and consequently, reduces the performance of the solar cell. In the present application, the range of w may be controlled, to improve the passivation effect without affecting the performance of the solar cell.

In the present application, w may be controlled in the foregoing range, to improve iVoc of the solar cell, and improve the passivation performance of the solar cell. In addition, either an n-type doped structure or a p-type doped structure formed by using the foregoing structure can effectively improve the passivation performance of the solar cell formed thereby.

In some embodiments, d2/d1 is defined as x, and x is equal to or greater than 1, for example, may be 1, 10, 20, 100, 1000, 1E4, 5E4, 1E5, 5E5, 1E6, 5E6, 1E7, 5E7, 1E8, or any value between these values. In some embodiments, x ranges from 10 to 1E8. In some embodiments, x ranges from 20 to 1E7.

In the present application, larger d2 indicates a better passivation effect of the formed emitter electrode or high-low junction, and indicates higher performance of the solar cell. Therefore, d2 cannot be excessively small, in other words, x cannot be excessively small. If x is excessively small, the passivation effect of the formed emitter electrode or high-low junction becomes poor. However, excessively large d2 makes an Auger composition region excessively wide, and consequently, reduces the performance of the solar cell. In the present application, the range of x may be controlled, to improve the passivation effect without affecting the performance of the solar cell.

In the present application, similar to the effect of w, x may be controlled in the foregoing range, to improve iVoc of the solar cell, and improve the passivation performance of the solar cell. In addition, either an n-type doped structure or a p-type doped structure formed by using the foregoing structure can effectively improve the passivation performance of the solar cell formed thereby.

In some embodiments, a peak concentration of the antimony element in the interface passivation layer 2 is a2, and a2 ranges from 1E13 to 1E18 atoms/cm3. The interface passivation layer includes the Bx element, a peak concentration of the Bx element in the interface passivation layer 2 is b2, and b2 ranges from 1E19 to 1E22 atoms/cm3. This is because when the Bx element in the interface passivation layer 2 is excessively low, carrier transmission efficiency of the interface passivation layer 2 becomes low, and affected by a solid solubility, the concentration denoted by b2 cannot reach above 1E22 atoms/cm3. In addition, the interface passivation layer 2 has antimony element of 1E13 to 1E18 atoms/cm3, and it can be ensured that the carrier separation layer has a preset concentration of the antimony element.

In some embodiments, b2/a2 is defined as y, and y>1, for example, may be 1, 2, 5, 10, 50, 100, 500, 1000, 1E5, 5E5, 1E6, 5E6, 1E7, 5E7, 1E8, 5E8, 1E9, or any value between these values. In some embodiments, y ranges from 10 to 1E9.

In some embodiments, when the Bx element is an element selected from Group-VA or Group-VIA, the thickness d1 of the region in which the concentration of the antimony element is equal to or greater than 1E13 atoms/cm3 in the antimony-containing layer 4 is 2 nm or higher, and w ranges from 1E4 to 1E8. When the Bx element is an element selected from Group-VA or Group-VIA, the escaping antimony element is also an element of Group-VA, and this increases an effective doping concentration of the carrier separation layer, further increases an electron concentration of the carrier separation layer, improves the passivation effect and electrical conduction of the carrier separation layer, reduces a transmission resistance of the carrier separation layer, and reduces an interface resistance between the silicon substrate and the carrier separation layer.

Further, a concentration of the Bx element in the doped semiconductor layer 3 ranges from 1E19 to 5E22 atoms/cm3. When the Bx element is a phosphorus element, in this case, the Bx-containing layer is a phosphorus-containing layer, and a thickness d2 of a region in which a concentration of the phosphorus element is greater than 1E17 atoms/cm3 in the phosphorus-containing layer is 20 nm or higher, preferably, is 30 nm or higher, 40 nm or higher, or 50 nm or higher, and further preferably, the thickness d2 is 120 nm or higher, 200 nm or higher, or 300 nm or higher.

In some embodiments, when the Bx element is an element selected from Group-IIIA, the thickness d1 of the region in which the concentration of the antimony element is greater than 1E13 atoms/cm3 in the antimony-containing layer 4 is 3 nm or higher, and preferably, w ranges from 1E3 to 1E7.

In some embodiments, when the carrier separation layer is a silicon film, when Bx is an element of Group-IIIA, the carrier separation layer is p-type. Therefore, as a Group-VA element, the antimony element has a higher doping speed in the carrier separation layer, and forms a thicker antimony-containing layer.

Further, the concentration of the Bx element in the doped semiconductor layer 3 ranges from 1E18 to 5E21 atoms/cm3. When the Bx element is boron element, in this case, the Bx-containing layer is a boron-containing layer, and a thickness d2 of a region in which a concentration of the boron element is greater than 1E17 atoms/cm3 in the boron-containing layer is 30 nm or higher, preferably, 40 nm or higher, or 50 nm or higher, and further preferably, the thickness d2 is 100 nm or higher, 200 nm or higher, 300 nm or higher, 400 nm or higher, 500 nm or higher, 600 nm or higher, 700 nm or higher, 800 nm or higher, 900 nm or higher, 1000 nm or higher, 1100 nm or higher, or 1200 nm or higher.

A person skilled in the art may understand that, the foregoing silicon solar cell may cover various types of silicon solar cells having the structure shown in FIG. 2, provided that a structure of the solar cell, concentrations of the antimony element and the Bx element in the solar cell, and a distribution condition of the antimony element and the Bx element in the solar cell all satisfy the foregoing content. For example, the silicon solar cell mentioned in the present application may be a TOPCon solar cell, a partial TOPCon solar cell, a back contact solar cell, an HPBC solar cell, or the like.

In some embodiments, the silicon solar cell is a TOPCon solar cell, and has the structure shown in FIG. 2. Generally, the TOPCon cell includes: a silicon substrate 1, where the silicon substrate 1 includes an antimony element: an interface passivation layer 2, formed on the silicon substrate 1; and a doped semiconductor layer 3, where the doped semiconductor layer 3 is a doped semiconductor layer and is formed on the interface passivation layer 2. At least some regions of the doped semiconductor layer 3 on a side close to the silicon substrate 1 have an antimony-containing layer 4 formed by the antimony element; and a peak concentration of the antimony element in the antimony-containing layer 4 is a1, and a1 is equal to or greater than 1E13 atoms/cm3. The doped semiconductor layer 3 may be a p-type doped semiconductor layer or an n-type doped semiconductor layer.

When the doped semiconductor layer 3 is a p-type doped semiconductor layer, and an n-type doped semiconductor layer is formed on another side of the silicon substrate 1 away from the p-type doped semiconductor layer, a peak concentration of the antimony element in the antimony-containing layer is a1p, a/a1p is defined as up, and up ranges from 0.8 to 1E10, preferably, from 2 to 1E9, further preferably, from 10 to 1E8, and preferably, from 100 to 1E7.

In a specific manner, a thickness d1p of a region in which a concentration of the antimony element is equal to or greater than 1E13 atoms/cm3 in the antimony-containing layer is 3 nm or higher.

When the doped semiconductor layer 3 is an n-type doped semiconductor layer, and a p-type doped semiconductor layer is formed on another side of the silicon substrate 1 away from the n-type doped semiconductor layer, a peak concentration of the antimony element in the antimony-containing layer is a1n, a/a1n is defined as un, and un ranges from 0.8 to 1E10, preferably, from 2 to 1E9, further preferably, from 10 to 1E8, and preferably, from 100 to 1E7.

In a specific manner, a thickness d1n of a region in which a concentration of the antimony element is equal to or greater than 1E13 atoms/cm3 in the antimony-containing layer is 2 nm or higher.

When u, un, or up is controlled within the foregoing range, Auger composition and air bubbles can be both taken into consideration. More escaping antimony element indicates fewer air bubbles and better surface passivation, and Auger composition of the semiconductor layer can be reduced.

In some embodiments, the structure shown in FIG. 2 is formed on a front surface or a back surface of the silicon substrate. When the structure shown in FIG. 2 is formed on the back surface of the silicon substrate, in other words, the interface passivation layer 2 is disposed on the back surface of the silicon substrate, a p-type doped semiconductor layer or an n-type doped semiconductor layer is disposed on a side of the interface passivation layer 2 facing away from the silicon substrate. In other words, the carrier separation layer and the interface passivation layer 2 are formed on the back surface of the silicon substrate, and form a PN junction with the silicon substrate. In this case, because antimony tends to occupy substitutional rather than interstitial sites in silicon substrates, less composition is generated, and performance of a solar cell in which the TOPCon structure shown in FIG. 2 is disposed on the back surface as an emitter electrode is more advantageous.

Figure 3:
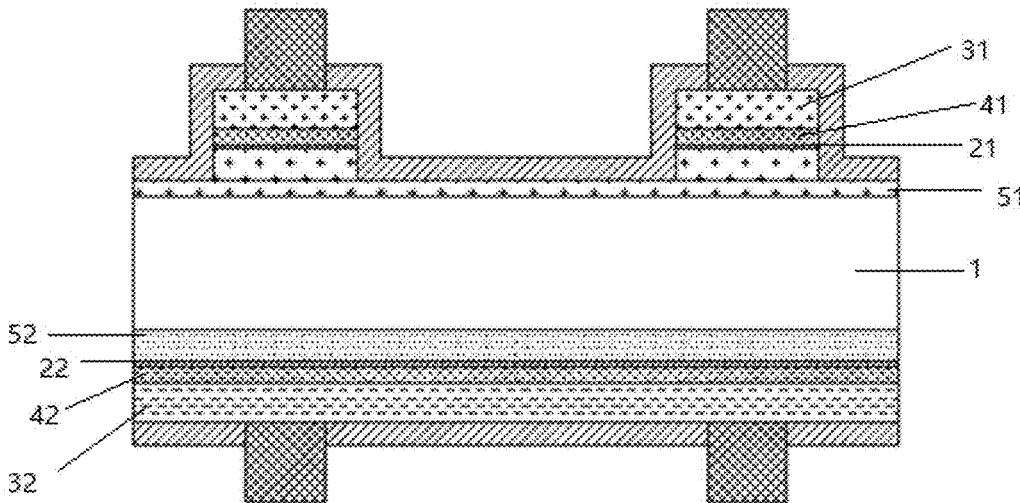
FIG. 3 is a structural diagram of a partial TOPCon solar cell including an antimony element.
Figure 4:
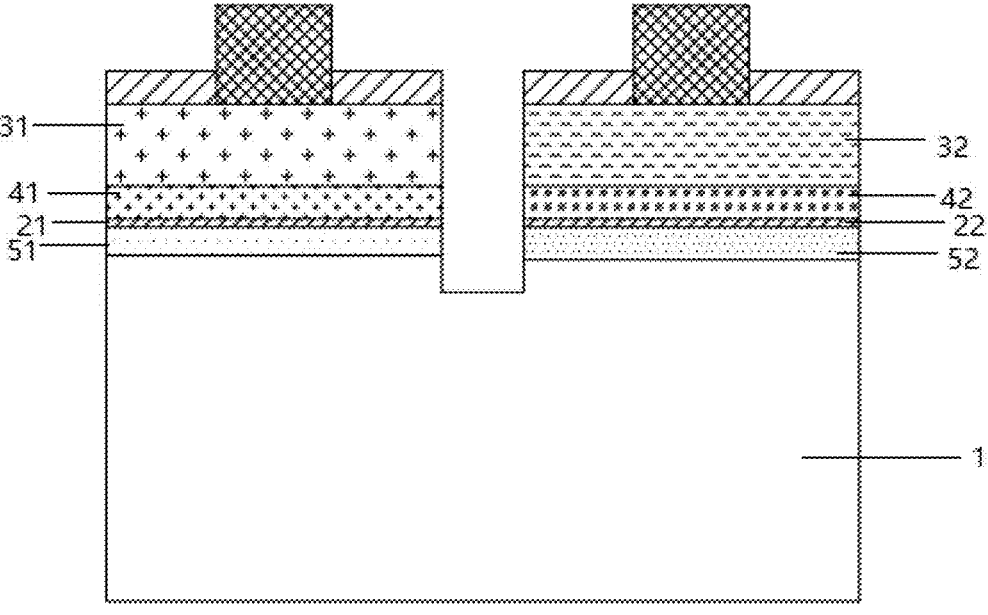
FIG. 4 is a structural diagram of a back contact solar cell including an antimony element.
Figure 5:
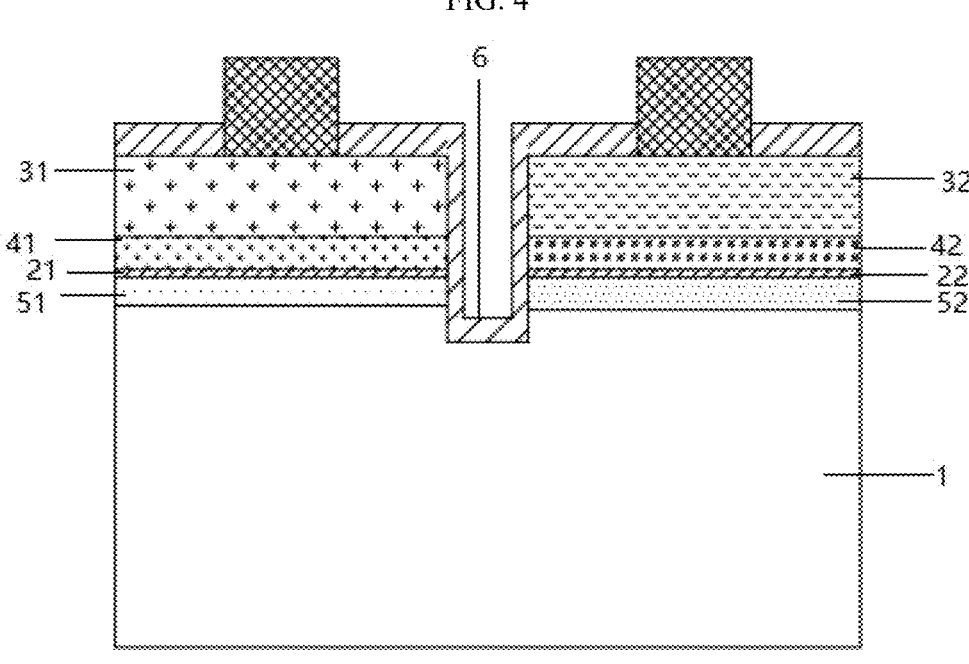
FIG. 5 is a structural diagram of a back contact solar cell including an antimony element.
Figure 6:
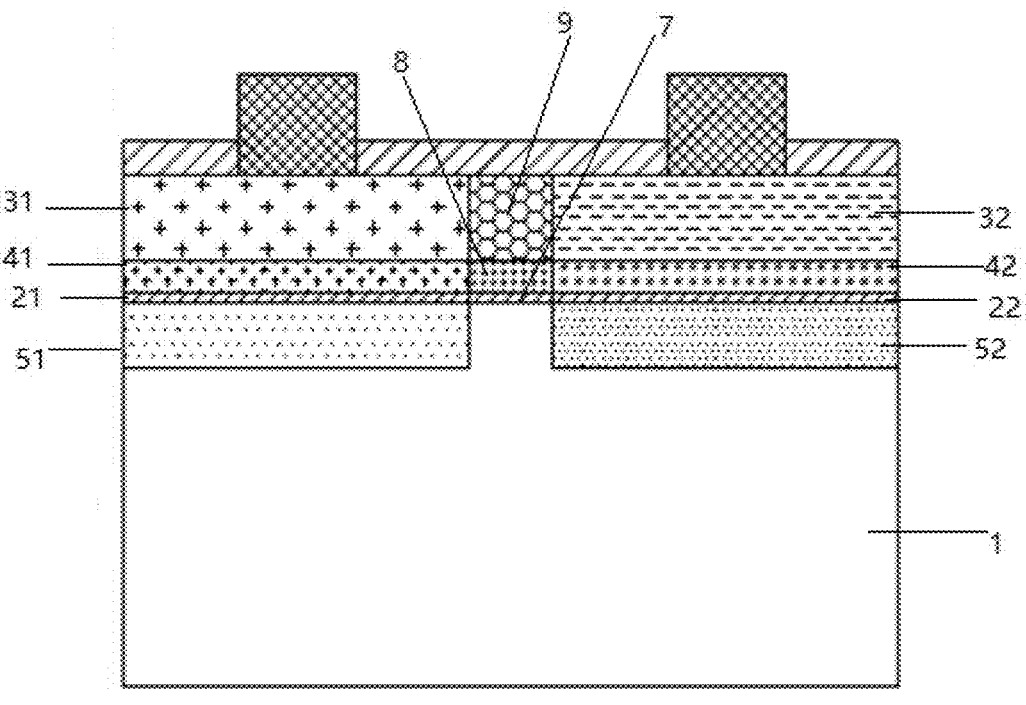
FIG. 6 is a structural diagram of a back contact solar cell including an antimony element.
Figure 7:
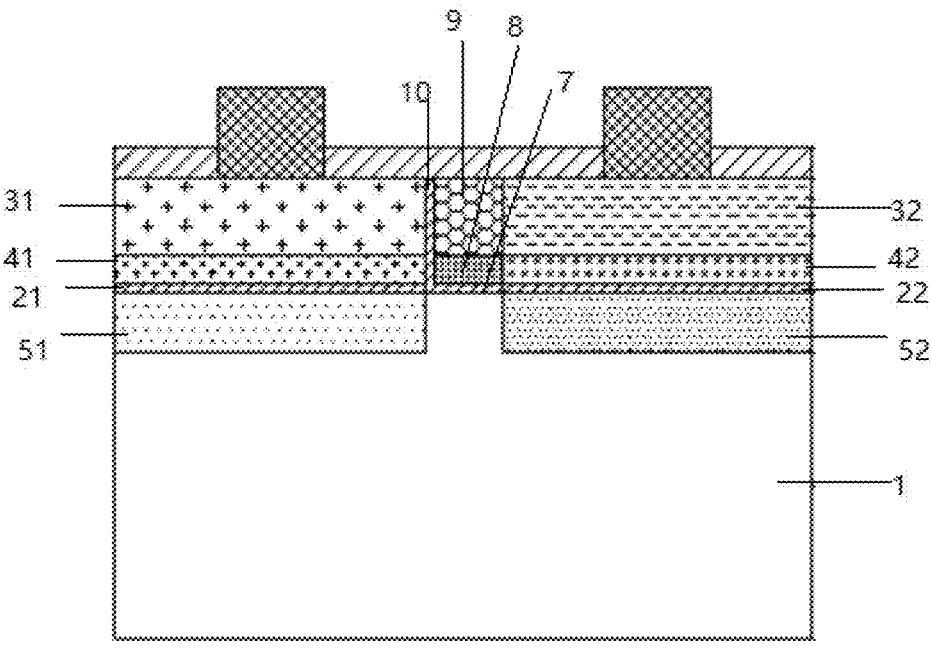
FIG. 7 is a structural diagram of a back contact solar cell including an antimony element.

In some embodiments, the silicon solar cell is a partial TOPCon solar cell. As shown in FIG. 3, the partial TOPCon solar cell includes: a silicon substrate 1, where the silicon substrate 1 includes an antimony element; a first interface passivation layer 21 and a second interface passivation layer 22, respectively formed on two sides of the silicon substrate 1; a first doped semiconductor layer 31 and a second doped semiconductor layer 32, each being a doped semiconductor layer and respectively formed on a side of the first interface passivation layer 21 away from the silicon substrate 1 and a side of the second interface passivation layer 22 away from the silicon substrate 1, where an area of the first doped semiconductor layer 31 is less or greater than an area of the second doped semiconductor layer 32. FIG. 3 shows a case in which the first doped semiconductor layer 31 is formed on a part of regions of the silicon substrate 1, and the second doped semiconductor layer 32 is formed on all regions of the silicon substrate 1. However, a person skilled in the art may completely understand that such a structure is merely exemplary. A person skilled in the art may design a structure of the partial TOPCon solar cell based on understanding of the partial TOPCon solar cell.

The first doped semiconductor layer 31 is doped with a Group-IIIA element, and the second doped semiconductor layer 32 is doped with a Group-VA element or a Group-VIA element. At least a part of regions of the first doped semiconductor layer 31 on a side close to the first interface passivation layer 21 have a first antimony-containing layer 41, and the first antimony-containing layer 41 includes the antimony element. At least a part of regions of the second doped semiconductor layer 32 on a side close to the second interface passivation layer 22 have a second antimony-containing layer 42, and the second antimony-containing layer 42 includes the antimony element. A peak concentration of the antimony element in the first antimony-containing layer 41 is a1p, and a1p is equal to or greater than 1E13 atoms/cm3. A peak concentration of the antimony element in the second antimony-containing layer 42 is a1n, and a1n is equal to or greater than 1E13 atoms/cm3.

A person skilled in the art may understand that, concentrations and distributions of the antimony element and the doping element in the first interface passivation layer 21 and the second interface passivation layer 22, and the first doped semiconductor layer 31 and the second doped semiconductor layer 32 all satisfy the foregoing descriptions for the interface passivation layer 2 and the doped semiconductor layer 3.

In a specific manner, for the solar cell shown in FIG. 3, a thickness d1p of a region in which a concentration of the antimony element in the first antimony-containing layer is equal to or greater than 1E13 atoms/cm3 is equal to or greater than a thickness din of a region in which a concentration of the antimony element in the second antimony-containing layer is equal to or greater than 1E13 atoms/cm3, that is, d1p≥d1n.

Specifically, the thickness d1p of the region in which the concentration of the antimony element in the first antimony-containing layer 41 is equal to or greater than 1E13 atoms/cm3 is 3 nm or higher, and the thickness din of the region in which the concentration of the antimony element in the second antimony-containing layer 42 is equal to or greater than 1E13 atoms/cm3 is 2 nm or higher.

In a direction from a side close to the silicon substrate 1 to a side facing away from the silicon substrate 1, a concentration of the antimony element in the antimony-containing layer of the doped semiconductor layer 31 gradually decreases. In a direction from a side close to the silicon substrate 1 to a side facing away from the silicon substrate 1, a concentration of the antimony element in the antimony-containing layer of the doped semiconductor layer 32 gradually decreases.

a/a1p is defined as up, up ranges from 0.8 to 1E10, preferably, from 2 to 1E9, further preferably, from 10 to 1E8, and preferably, from 100 to 1E7; and a/a1n is defined as un, un ranges from 0.8 to 1E10, preferably, from 2 to 1E9, further preferably, from 10 to 1E8, and preferably, from 100 to 1E7.

At least some regions of the silicon substrate 1 on a side close to the first interface passivation layer 21 have a Bxp element, to form a Bxp-containing layer 51; at least some regions of the silicon substrate 1 on a side close to the second interface passivation layer 22 have a Bxn element, to form a Bxn-containing layer 52; a thickness d2p of a region in which a concentration of the Bxp element in the Bxp-containing layer 51 is greater than 1E17 atoms/cm3 is 30 nm or higher; and a thickness d2n of a region in which a concentration of the Bxn element in the Bxn-containing layer 52 is greater than 1E17 atoms/cm3 is 20 nm or higher.

The Bxp element is an element selected from Group-IIIA, a concentration of the Bxp element in the first doped semiconductor layer 31 is bp, bp ranges from 1E18 to 5E21 atoms/cm3, and a peak concentration of the Bxp element in the Bxp-containing layer 51 is b1p. The Bxn element is an element selected from Group-VA or Group VIA, a concentration of the Bxn element in the second doped semiconductor layer 32 is bn, bn ranges from 1E19 to 5E22 atoms/cm3, and a peak concentration of the Bxn element in the Bxn-containing layer 52 is b1n. bp/b1p is defined as vp, and vp ranges from 1 to 1E10, preferably, from 2 to 1E9, further preferably, from 10 to 1E8, and preferably, from 100 to 1E5. bn/b1n is defined as vn, and vn ranges from 0.5 to 1E10, preferably, from 2 to 1E9, further preferably, from 10 to 1E8, and preferably, from 100 to 1E5.

b1p/a1p is defined as wp, wp>1, preferably, wp>100, preferably, wp is greater than 1000, preferably, wp ranges from 1E3 to 1E8, and further preferably, wp ranges from 1E3 to 1E7. b1n/a1n is defined as wn, wn>1, preferably, wn>100, preferably, wn is greater than 1000, preferably, wn ranges from 1E3 to 1E8, and further preferably, wn ranges from 1E4 to 1E8. In the present application, wp may be controlled in the foregoing range, to improve iVoc of the solar cell, and improve the passivation performance of the solar cell. In the present application, wn may be controlled in the foregoing range, to improve iVoc of the solar cell, and improve the passivation performance of the solar cell.

d2p/d1p is greater than or equal to 1, and preferably, ranges from 10 to 1E8, further preferably, from 20 to 1E7. d2n/d1n is greater than or equal to 1, and preferably, ranges from 10 to 1E8, further preferably, from 20 to 1E7. Preferably, d1p≥d1n; and/or d2p>d2n, preferably, d2p−d2n≥5 nm, and preferably, d2p−d2n≥10 nm.

Because it is controlled that d2p>d2n, in this case, after light is irradiated on the silicon substrate, one effective photon may excite one electron-hole pair, and under separation of a PN junction, the electron-hole pair may be separated at the PN junction, to form electron carriers and hole carriers. When d2p>d2n, it can be ensured that the PN junction can effectively separates the carriers. Because the p-region is an emitter electrode region, a better passivation effect is needed. Therefore, when d1p≥d1n, more antimony element can overflow, and this helps interface passivation of a carrier selection layer of the emitter electrode region. The emitter electrode is more important for the solar cell, to be specific, a passivation effect of the emitter electrode is good, and better efficiency of the solar cell can be achieved.

In the present application, similar to the effect of wp, d2p/d1p may be controlled in the foregoing range, to improve iVoc of the solar cell, and improve the passivation performance of the solar cell. In the present application, similar to the effect of wn, d2n/d1n may be controlled in the foregoing range, to improve iVoc of the solar cell, and improve the passivation performance of the solar cell.

The first interface passivation layer 21 includes the antimony element, a peak concentration of the antimony element in the first interface passivation layer 21 is a2p, and a2p ranges from 1E13 to 1E18 atoms/cm3. The first interface passivation layer 21 includes the Bxp element, a peak concentration of the Bxp element in the first interface passivation layer 21 is b2p, and b2p ranges from 1E19 to 1E22 atoms/cm3. Preferably, b2p/a2p>1, and preferably, ranges from 10 to 1E9.

The second interface passivation layer 22 includes the antimony element, a peak concentration of the antimony element in the second interface passivation layer 22 is a2n, and a2n ranges from 1E13 to 1E18 atoms/cm3. The second interface passivation layer 22 includes the Bxn element, a peak concentration of the Bxn element in the second interface passivation layer 22 is b2n, and b2n ranges from 1E19 to 1E22 atoms/cm3. Preferably, b2n/a2n>1, and preferably, ranges from 10 to 1E9.

When the Bxn element is phosphorus element, in this case, a thickness d2n of a region in which a concentration of the phosphorus element is greater than 1E17 atoms/cm3 in the Bxn-containing layer 52 is 20 nm or higher, preferably, is 30 nm or higher, 40 nm or higher, or 50 nm or higher, and further preferably, the thickness d2n is 120 nm or higher, 200 nm or higher, or 300 nm or higher. When the Bxp element is a boron element, in this case, a thickness d2p of a region in which a concentration of the boron element is greater than 1E17 atoms/cm3 in the Bxp-containing layer 51 is 30 nm or higher, preferably, 40 nm or higher, or 50 nm or higher, and further preferably, the thickness d2p is 100 nm or higher, 200 nm or higher, 300 nm or higher, 400 nm or higher, 500 nm or higher, 600 nm or higher, 700 nm or higher, 800 nm or higher, 900 nm or higher, 1000 nm or higher, 1100 nm or higher, or 1200 nm or higher.

In some embodiments, the silicon solar cell is a back contact solar cell. FIG. 4 to FIG. 7 show structures of several typical back contact solar cells. The back contact solar cell includes: a silicon substrate 1, where the silicon substrate 1 includes an antimony element; a first interface passivation layer 21 and a second interface passivation layer 22, respectively formed on two sides of the silicon substrate 1; and a first doped semiconductor layer 31 and a second doped semiconductor layer 32, where the first doped semiconductor layer 31 and the second doped semiconductor layer 32 are both doped semiconductor layers, and are respectively formed on a side of the first interface passivation layer 21 away from the silicon substrate 1 and a side of the second interface passivation layer 22 away from the silicon substrate 1, the first doped semiconductor layer 31 is doped with a Group-IIIA element, and the second doped semiconductor layer 32 is doped with a Group-VA element or a Group-VIA element. At least some regions of the first doped semiconductor layer 31 on a side close to the first interface passivation layer 21 have a first antimony-containing layer 41, the first antimony-containing layer 41 includes the antimony element; and at least some regions of the second doped semiconductor layer 32 on a side close to the second interface passivation layer 22 have a second antimony-containing layer 42, and the second antimony-containing layer 42 includes the antimony element. A peak concentration of the antimony element in the first antimony-containing layer 41 is a1p, and a1p is equal to or greater than 1E13 atoms/cm3; and a peak concentration of the antimony element in the second antimony-containing layer 42 is a1n, and a1n is equal to or greater than 1E13 atoms/cm3. The first interface passivation layer 21 and the first doped semiconductor layer 31 form a p-type region, and the second interface passivation layer 22 and the second doped semiconductor layer 32 form an n-type region.

For concentrations and distributions of the antimony element and doping elements in the silicon substrate 1, the first interface passivation layer 21, the second interface passivation layer 22, the first doped semiconductor layer 31, and the second doped semiconductor layer 32, refer to the foregoing descriptions for the partial TOPCon solar cell.

In a specific manner, for the solar cells shown in FIG. 4 to FIG. 7, a thickness d1p of a region in which a concentration of the antimony element in the first antimony-containing layer is equal to or greater than 1E13 atoms/cm3 is equal to or greater than a thickness d1n of a region in which a concentration of the antimony element in the second antimony-containing layer is equal to or greater than 1E13 atoms/cm3, that is, d1p≥d1n.

As shown in FIG. 4 to FIG. 7, there is a GAP region between the p-type region and the n-type region, a substrate passivation layer 6 is disposed in the GAP region, and the substrate passivation layer 6 covers a GAP region of the silicon substrate 1 not covered by the p-type region and the n-type region.

Further, an antimony-containing region is formed in a region of the substrate passivation layer 6 close to the silicon substrate 1, and a concentration of the antimony element in the antimony-containing region is a3, a thickness of a region in which a3 is greater than 1E13 atoms/cm3 is d1 passivation layer, d1 passivation layer≤d1n≤d1p, and preferably, d1 passivation layer≥1 nm.

d1 passivation layer≤d1n≤d1p, because the passivation layer is not an electrically active region, and therefore, is not limited to a large extent. Passivation may be directly performed by using a passivation material such as aluminum oxide/silicon nitride with high passivation quality. Therefore, excessively much antimony element for reducing air bubbles is not needed to improve the passivation effect of the passivation region. For a technical effect of d1n≤d1p, refer to the foregoing specification, and details are not described herein again.

In the present application, it is controlled that d1 passivation layer≤d1n≤d1p, so that the passivation performance of the PN region can be improved, iVoc of the GAP region can be further improved, and the passivation performance of the solar cell can also be improved.

A GAP region between the p-type region and the n-type region may be an intrinsic GAP region, and the intrinsic GAP region covers a GAP region of the silicon substrate 1 not covered by the p-type region and the n-type region. The intrinsic GAP region sequentially includes, from the silicon substrate 1 toward a direction away from the silicon substrate, an intrinsic semiconductor layer 8 containing the antimony element and an intrinsic semiconductor layer 9 not containing the antimony element, and preferably, sequentially includes, from the silicon substrate toward the direction away from the silicon substrate, an intrinsic region interface passivation layer 7, an intrinsic semiconductor layer 8 containing the antimony element, and an intrinsic semiconductor layer 9 not containing the antimony element.

A concentration of the antimony element of the intrinsic semiconductor layer 8 containing the antimony element is a3, and a thickness of a region in which a3 is greater than 1E13 atoms/cm3 is d1i; d1i≤d1n≤d1p; and preferably, d1i≥2 nm.

In the present application, it is controlled that d1 passivation layer≤d1n, and therefore, excessively much antimony element for reducing air bubbles is not needed, and the passivation effect of the passivation region can be improved.

In the present application, because the intrinsic semiconductor has slightly poor passivation performance, and generally, because the intrinsic semiconductor layer has not undergone many thermal processes, the intrinsic semiconductor layer may have a poor crystal structure. Therefore, a slightly larger amount of antimony element is needed to improve a passivation effect of the bottom layer. Therefore, controlling that d1i≥2 nm can better maintain the passivation effect.

In the present application, it is controlled that d1i≤d1n≤d1p, so that the passivation performance of the PN region can be improved, iVoc of the GAP region can be further improved, and the passivation performance of the solar cell can also be improved.

A region in the intrinsic region interface passivation layer 7 close to the silicon substrate 1 may include the antimony element, and a concentration of the antimony element included in the intrinsic region interface passivation layer 7 is a3, a thickness of a region in which a3 is greater than 1E13 atoms/cm3 is d1 passivation layer, d1 passivation layer≤d1n≤d1p, and preferably, d1 passivation layer≥2 nm. In the present application, d1 passivation layer≤d1n≤d1p may be controlled in the foregoing range, so that the passivation performance of the PN region can be improved, iVoc of the GAP region can be further improved, and the passivation performance of the solar cell can also be improved.

Further, an intrinsic region side interface passivation layer 10 may be disposed between the intrinsic GAP region and the p-type region or between the intrinsic GAP region and the n-type region. The side interface passivation layer 10 may be disposed on a side close to the p-type region, or may be disposed on a side close to the n-type region.

Figure 8:
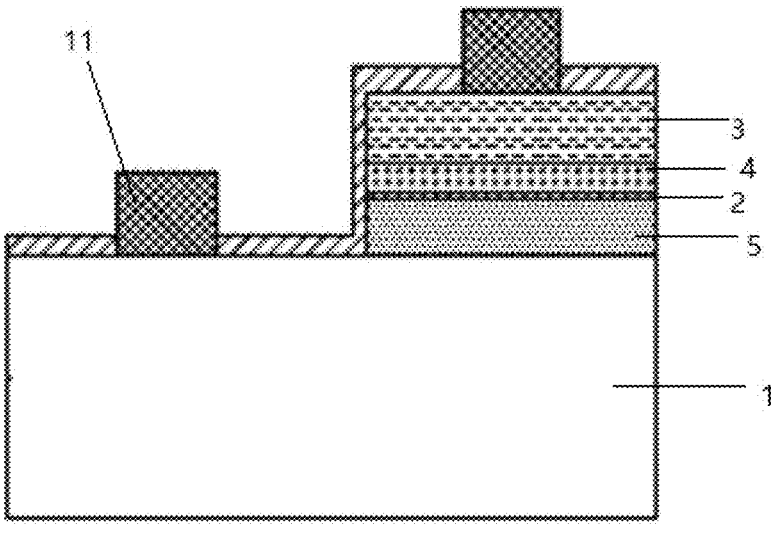
FIG. 8 is a structural diagram of a back contact solar cell (HPBC structure) including an antimony element.

In some embodiments, the silicon solar cell is a back contact solar cell of an HPBC structure. As shown in FIG. 8, the back contact cell of the HPBC structure includes: a silicon substrate 1, where the silicon substrate 1 includes an antimony element; an interface passivation layer 2, formed on the silicon substrate 1; a doped semiconductor layer 3, which is a doped semiconductor layer and is formed on the interface passivation layer 2 and is an n-type doped semiconductor layer to form an n-type region; a p-region electrode 11, which is formed on a side of the silicon substrate having the n-type doped semiconductor layer and is arranged spaced apart from the n-type doped semiconductor layer; and a BSF layer, which is formed in the silicon substrate 1 corresponding to the p-region electrode 11, where the BSF layer and the p-region electrode have the same metal element. At least some regions of the doped semiconductor layer 3 on a side close to the silicon substrate 1 have an antimony-containing layer 4 formed by the antimony element, and a peak concentration of the antimony element in the antimony-containing layer 4 is a1n, and a1n is equal to or greater than 1E13 atoms/cm3.

The p-region electrode may be a metal electrode that can form a p-region and that is known in the art, for example, may be an aluminum electrode.

For concentrations and distributions of the antimony element and doping elements in the silicon substrate 1, the interface passivation layer 2, the doped semiconductor layer 3, and the antimony-containing layer 4, refer to the foregoing descriptions in which the doping element Bx is an element selected from Group-VA or Group-VIA.

The present application further provides a solar cell module, including any one of the foregoing silicon solar cells.

EMBODIMENTS

Materials and test methods used in the test are generally and/or specifically described in the present application. In the following embodiments, % represents wt %, that is, a weight percentage, if no other particular descriptions are provided. Used agents or instruments whose manufacturers are not specified are all common commercial products of agents or instruments.

Preparative Examples

Silicon wafers with different concentrations of antimony and different concentrations of phosphorus were prepared based on the method described in CN117702269A. The concentrations of the phosphorus element and the concentration of the antimony element in the prepared silicon wafers are shown in Table 1.

Embodiment 1 Comparison Test of Air Bubble (Concentration of Antimony)

An n-type silicon wafer is polished by using an alkaline solution, cleaned by using acid pickling, and is washed and slowly pulled. After being dried, the n-type silicon wafer is placed in an LPCVD furnace tube to perform one-sided deposition of a tunnel oxide layer and an amorphous silicon layer. Then, 900° C. crystallization processing is performed. Each tube of test wafers includes 1600 silicon wafers, and 12 slices are extracted from each tube. Whether an air bubble occurs on a surface with poly on the entire surface is detected. Statistical data is shown in the following Table 1:

TABLE 1

|  | Concentration of phosphorous or antimony in a silicon wafer | Peak concentration of phosphorous or antimony in a silicon wafer | Quantity of experiment batches | Quantity of testing wafers (1600 wafers in each batch) | Quantity (of wafers) selected for test in each batch | Quantity of wafers with air bubbles (air explosions) | Proportion of wafers with air bubbles | Quantity of batches with air bubbles | Proportion of batches with air bubbles |
|---|---|---|---|---|---|---|---|---|---|
| n-type phosphorus-containing silicon wafer | 1E15 atoms/cm³ | 1E15 atoms/cm³ | 10 | 16000 | 10 | 23 | 23% | 5 | 50% |
| n-type antimony-containing silicon wafer | 1E15 atoms/cm³ | 1E15 atoms/cm³ | 10 | 16000 | 10 | 2 | 2% | 1 | 10% |
| n-type antimony-containing silicon wafer | 1E13 atoms/cm³ | 1E13 atoms/cm³ | 10 | 16000 | 10 | 3 | 3% | 2 | 20% |

TABLE 1-continued

| | Concentration of phosphorous or antimony in a silicon wafer | Peak concentration of phosphorous or antimony in a silicon wafer | Quantity of experiment batches | Quantity of testing wafers (1600 wafers in each batch) | Quantity (of wafers) selected for test in each batch | Quantity of wafers with air bubbles (air explosions) | Proportion of wafers with air bubbles | Quantity of batches with air bubbles | Proportion of batches with air bubbles |
|---|---|---|---|---|---|---|---|---|---|
| n-type antimony - containing silicon wafer | 1E14 atoms/cm$^3$ | 1E14 atoms/cm$^3$ | 10 | 16000 | 10 | 3 | 3% | 2 | 20% |
| n-type antimony - containing silicon wafer | 1E16 atoms/cm$^3$ | 1E16 atoms/cm$^3$ | 10 | 16000 | 10 | 1 | 1% | 1 | 10% |
| n-type antimony - containing silicon wafer | 1E18 atoms/cm$^3$ | 1E18 atoms/cm$^3$ | 10 | 16000 | 10 | 1 | 1% | 1 | 10% |

It can be seen that, when the antimony-containing silicon wafer is used, the quantities of poly wafers in which air bubbles occur decrease very obviously. The quantity of batches in which poly air bubbles occur also decreases obviously.

Embodiment 2 Comparison Test of Passivation Quality of Boron-Doped Poly

The n-type silicon wafer (in which the n-type phosphorus-containing silicon wafer with a phosphorus concentration of 1E15 atoms/cm3 and the n-type antimony-containing silicon wafer with an antimony concentration of 1E15 atoms/cm3) prepared in the foregoing Embodiment 1 is polished by using an alkaline solution, cleaned by using acid pickling, and is washed and slowly pulled. After being dried, the n-type silicon wafer is placed in an LPCVD furnace tube to perform one-sided deposition of a tunnel oxide layer and an amorphous silicon layer. Then, a boron diffusion doping crystallization treatment is performed (where a maximum doping temperature is 950° C., and a BBr3 source is used for doping). HF is used to remove generated BSG (borosilicate glass), then aluminum oxide+silicon nitride film are coated on both sides of the silicon wafer, and then, an iVoc test is performed by using a Sinton test instrument. The test results are shown in Table 2.

TABLE 2

| B-poly two-sided sample | $b_1/a_1$ | Quantity of authentication times (wafers) | iVoc median (mV) |
|---|---|---|---|
| n-type phosphorus-containing silicon wafer | | 40 | 715 |
| n-type antimony-containing silicon wafer | 1E3 | 20 | 721 |
| n-type antimony-containing silicon wafer | 1E4 | 20 | 722 |
| n-type antimony-containing silicon wafer | 1E5 | 20 | 723 |
| n-type antimony-containing silicon wafer | 1E6 | 20 | 724 |
| n-type antimony-containing silicon wafer | 1E8 | 20 | 725 |

It can be seen that iVoc of the antimony-containing silicon wafer is obviously increased, indicating that the passivation performance is obviously improved.

Embodiment 3 Comparison Test of Passivation Quality of Phosphorus-Doped Poly

The n-type silicon wafer (in which the n-type phosphorus-containing silicon wafer with a phosphorus concentration of 1E15 atoms/cm3 and the n-type antimony-containing silicon wafer with an antimony concentration of 1E15 atoms/cm3) prepared in the foregoing Embodiment 1 is polished by using an alkaline solution, cleaned by using acid pickling, and is washed and slowly pulled. After being dried, the n-type silicon wafer is placed in an LPCVD furnace tube to perform one-sided deposition of a tunnel oxide layer and an amorphous silicon layer. Then, a phosphorus diffusion doping crystallization treatment is performed (where a maximum doping temperature is 850° C., and a POCl3 source is used for doping). HF is used to remove generated PSG (phosphosilicate glass), then aluminum oxide+silicon nitride film are coated on both sides of the silicon wafer, then, an iVoc test is performed by using a Sinton test instrument, and results are shown in Table 3.

TABLE 3

| P-poly two-sided sample | $b_1/a_1$ | Quantity of authentication times | iVoc median (mV) |
|---|---|---|---|
| n-type phosphorus-containing silicon wafer | | 40 | 750 |
| n-type antimony-containing silicon wafer | 1E3 | 40 | 755 |
| n-type antimony-containing silicon wafer | 1E4 | 40 | 756 |
| n-type antimony-containing silicon wafer | 1E5 | 40 | 756 |
| n-type antimony-containing silicon wafer | 1E6 | 40 | 757 |
| n-type antimony-containing silicon wafer | 1E8 | 40 | 758 |

It can be seen that iVoc of the antimony-containing silicon wafer is obviously increased, indicating that the passivation performance is obviously improved.

Although the implementations of the present application are described above, the present application is not limited to the foregoing specific implementations and application fields, and the foregoing specific implementations are merely exemplary and instructive rather than limitative. A person of ordinary skill in the art may further make, under the teaching of this specification, various forms without departing from the protection scope of the claims of the present application, and all the forms fall within the protection scope of the present application.

The invention claimed is:

1. A silicon solar cell, comprising:
a silicon substrate comprising an antimony element; and
a carrier separation layer formed on the silicon substrate,
wherein at least some regions of the carrier separation layer on a side close to the silicon substrate have an antimony-containing layer, wherein the antimony-containing layer comprising the antimony element,
wherein a concentration of the antimony element in the antimony-containing layer of the carrier separation layer decreases in a direction from the side close to the silicon substrate to a side facing away from the silicon substrate,
wherein a peak concentration of the antimony element in the antimony-containing layer is $a_1$, $a_1$ being equal to or greater than 1E13 atoms/cm$^3$,
wherein the carrier separation layer is selected from a doped semiconductor layer, a molybdenum oxide layer, or a PEDOT:PSS layer, and
wherein when the carrier separation layer is the doped semiconductor layer, the silicon solar cell comprises an interface passivation layer between the silicon substrate and the carrier separation layer.

2. The silicon solar cell according to claim 1, wherein:
a concentration of the antimony element in the silicon substrate is a, a ranging from 1E13 to 1E18 atoms/cm$^3$; or
a thickness $d_1$ of a region in which a concentration of the antimony element is equal to or greater than 1E13 atoms/cm$^3$ in the antimony-containing layer is 2 nm or higher.

3. The silicon solar cell according to claim 2, wherein a/ar is defined as u, u ranging from 0.8 to 1E10.

4. The silicon solar cell according to claim 2, wherein:
at least some regions of the silicon substrate on a side close to the interface passivation layer have a $B_x$ element, to form a $B_x$-containing layer; and
a thickness $d_2$ of a region in which a concentration of the $B_x$ element is greater than 1E17 atoms/cm$^3$ in the $B_x$-containing layer is 20 nm or higher.

5. The silicon solar cell according to claim 4, wherein:
the doped semiconductor layer comprises the $B_x$ element, a concentration of the $B_x$ element in the doped semiconductor layer being b, and b ranging from 1E18 to 5E22 atoms/cm$^3$;
a peak concentration of the $B_x$ element in the $B_x$-containing layer is b; and
b/$b_1$ is defined as v, v ranging from 0.5 to 1E10.

6. The silicon solar cell according to claim 5, wherein:
$b_1$/$a_1$ is defined as w, w>1.

7. The silicon solar cell according to claim 6, wherein:
the $B_x$ element is an element selected from Group-VA or Group-VIA,
the thickness $d_1$ of the region in which the concentration of the antimony element being equal to or greater than 1E13 atoms/cm$^3$ in the antimony-containing layer is 2 nm or higher.

8. The silicon solar cell according to claim 7, wherein:
a concentration of the $B_x$ element in the doped semiconductor layer ranges from 1E19 to 5E22 atoms/cm$^3$.

9. The silicon solar cell according to claim 6, wherein:
when the $B_x$ element is an element selected from Group-IIIA, and the thickness $d_1$ of the region in which the concentration of the antimony element is greater than 1E13 atoms/cm$^3$ in the antimony-containing layer is 3 nm or higher.

10. The silicon solar cell according to claim 9, wherein:
a concentration of the $B_x$ element in the doped semiconductor layer ranges from 1E18 to 5E21 atoms/cm$^3$.

11. The silicon solar cell according to claim 4, wherein:
$d_2$/$d_1$ is defined as x, x being greater than or equal to 1.

12. The silicon solar cell according to claim 1, wherein a material of the interface passivation comprises at least one of silicon oxide, aluminum oxide, silicon nitride, molybdenum oxide, or intrinsic amorphous silicon.

13. The silicon solar cell according to claim 1, wherein:
the doped semiconductor layer is a p-type doped semiconductor layer, and an n-type doped semiconductor layer is formed on a side of the silicon substrate close to the p-type doped semiconductor layer, a thickness $d_{1p}$ of a region in which a concentration of the antimony element is equal to or greater than 1E13 atoms/cm$^3$ in the antimony-containing layer is 3 nm or higher; or
the doped semiconductor layer is an n-type doped semiconductor layer, and a p-type doped semiconductor layer is formed on a side of the silicon substrate close to the n-type doped semiconductor layer, a thickness $d_{1n}$ of a region in which a concentration of the antimony element is equal to or greater than 1E13 atoms/cm$^3$ in the antimony-containing layer is 2 nm or higher.

14. The silicon solar cell according to claim 1, wherein:
the interface passivation layer comprises a first interface passivation layer and a second interface passivation layer, the first interface passivation layer and the second interface passivation layer being respectively formed on two sides of the silicon substrate;
the doped semiconductor layer comprises a first doped semiconductor layer and a second doped semiconductor layer, the first doped semiconductor layer and the second doped semiconductor layer being respectively formed on a side of the first interface passivation layer away from the silicon substrate and a side of the second interface passivation layer away from the silicon substrate, the first doped semiconductor layer being doped with a Group-IIIA element, and the second doped semiconductor layer being doped with a Group-VA element or a Group-VIA element;
an area of the first doped semiconductor layer is less than or greater than an area of the second doped semiconductor layer;
at least some regions of the first doped semiconductor layer on a side close to the first interface passivation layer have a first antimony-containing layer, the first antimony-containing layer comprising the antimony element; and at least some regions of the second doped semiconductor layer on a side close to the second interface passivation layer have a second antimony-containing layer, the second antimony-containing layer comprising the antimony element;
a peak concentration of the antimony element in the first antimony-containing layer is $a_{1p}$, and $a_{1p}$ is equal to or greater than 1E13 atoms/cm$^3$; and
a peak concentration of the antimony element in the second antimony-containing layer is $a_{1n}$, and $a_{1n}$ is equal to or greater than 1E13 atoms/cm$^3$.

15. The silicon solar cell according to claim 14, wherein:
a thickness of a region in which a concentration of the antimony element is equal to or greater than 1E13 atoms/cm$^3$ in the first antimony-containing layer is $d_{1p}$; and a thickness of a region in which a concentration of the antimony element is equal to or greater than 1E13 atoms/cm$^3$ in the second antimony-containing layer is $d_{1n}$, $d_{1p} \geq d_{1n}$.

16. The silicon solar cell according to claim 1, wherein:

the interface passivation layer comprises a first interface passivation layer and a second interface passivation layer, the first interface passivation layer and the second interface passivation layer are formed on a same side of the silicon substrate;

the doped semiconductor layer comprises a first doped semiconductor layer and a second doped semiconductor layer, and the first doped semiconductor layer and the second doped semiconductor layer are respectively formed on a side of the first interface passivation layer away from the silicon substrate and a side of the second interface passivation layer away from the silicon substrate;

the first doped semiconductor layer is doped with a Group-IIIA element, and the second doped semiconductor layer is doped with a Group-VA element or a Group-VIA element;

the first interface passivation layer and the first doped semiconductor layer form a p-type region, and the second interface passivation layer and the second doped semiconductor layer form an n-type region;

at least some regions of the first doped semiconductor layer on a side close to the first interface passivation layer have a first antimony-containing layer, the first antimony-containing layer comprises the antimony element, at least some regions of the second doped semiconductor layer on a side close to the second interface passivation layer have a second antimony-containing layer, and the second antimony-containing layer comprises the antimony element;

a peak concentration of the antimony element in the first antimony-containing layer is $a_{1p}$, and $a_{1p}$ is equal to or greater than 1E13 atoms/cm$^3$; and a peak concentration of the antimony element in the second antimony-containing layer is $a_{1n}$, and $a_{1n}$ is equal to or greater than 1E13 atoms/cm$^3$.

17. The silicon solar cell according to claim 16, wherein:

a thickness of a region in which a concentration of the antimony element is equal to or greater than 1E13 atoms/cm$^3$ in the first antimony-containing layer is $d_{1p}$; and a thickness of a region in which a concentration of the antimony element is equal to or greater than 1E13 atoms/cm$^3$ in the second antimony-containing layer is $d_{1n}$, $d_{1p} \geq d_{1n}$.

18. The silicon solar cell according to claim 17, wherein:

at least some regions of the silicon substrate on a side close to the first interface passivation layer have a $B_{xp}$ element, to form a $B_{xp}$-containing layer;

at least some regions of the silicon substrate on a side close to the second interface passivation layer have a $B_{xn}$ element, to form a $B_{xn}$-containing layer;

a thickness $d_{2p}$ of a region in which a concentration of the $B_{xp}$ element is greater than 1E17 atoms/cm$^3$ in the $B_{xp}$-containing layer is 30 nm or higher; and a thickness $d_{2n}$ of a region in which a concentration of the $B_{xn}$ element is greater than 1E17 atoms/cm$^3$ in the $B_{xn}$-containing layer is 20 nm or higher.

19. The silicon solar cell according to claim 18, wherein:

$d_{2p}/d_{1p}$ is greater than or equal to 1; and $d_{2n}/d_{1n}$ is greater than or equal to 1.

20. A solar cell module, comprising a silicon solar cell comprising:

a silicon substrate comprising an antimony element; and a carrier separation layer formed on the silicon substrate, wherein at least some regions of the carrier separation layer on a side close to the silicon substrate have an antimony-containing layer, wherein the antimony-containing layer comprising the antimony element, wherein a concentration of the antimony element in the antimony-containing layer of the carrier separation layer decreases in a direction from the side close to the silicon substrate to a side facing away from the silicon substrate, wherein a peak concentration of the antimony element in the antimony-containing layer is $a_1$, $a_1$ being equal to or greater than 1E13 atoms/cm$^3$, wherein the carrier separation layer is selected from a doped semiconductor layer, a molybdenum oxide layer, or a PEDOT:PSS layer, and wherein when the carrier separation layer is the doped semiconductor layer, the silicon solar cell comprises an interface passivation layer between the silicon substrate and the carrier separation layer.

* * * * *